(12) United States Patent
Gardner et al.

(10) Patent No.: US 12,464,703 B2
(45) Date of Patent: Nov. 4, 2025

(54) 3D HORIZONTAL DRAM WITH IN-SITU BRIDGE

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 579 days.

(21) Appl. No.: 17/946,690

(22) Filed: Sep. 16, 2022

(65) Prior Publication Data

US 2023/0262956 A1  Aug. 17, 2023

Related U.S. Application Data

(60) Provisional application No. 63/310,205, filed on Feb. 15, 2022.

(51) Int. Cl.
| | | |
|---|---|---|
| *H10B 12/00* | (2023.01) | |
| *H10D 30/67* | (2025.01) | |
| *H10D 62/13* | (2025.01) | |
| *H10D 84/01* | (2025.01) | |
| *H10D 84/03* | (2025.01) | |

(52) U.S. Cl.
CPC ............. *H10B 12/30* (2023.02); *H10B 12/03* (2023.02); *H10B 12/05* (2023.02); *H10D 30/6735* (2025.01); *H10D 30/6757* (2025.01); *H10D 62/151* (2025.01); *H10D 84/0128* (2025.01); *H10D 84/013* (2025.01); *H10D 84/038* (2025.01)

(58) Field of Classification Search
CPC ........ H10B 12/30; H10B 12/03; H10B 12/05; H10D 30/6735; H10D 30/6757; H10D 84/013
See application file for complete search history.

(56) References Cited

U.S. PATENT DOCUMENTS

| | | | |
|---|---|---|---|
| 2002/0014649 A1* | 2/2002 | Kunikiyo | H10B 12/0335 257/306 |
| 2021/0098566 A1* | 4/2021 | Chern | H10D 1/042 |
| 2021/0375875 A1* | 12/2021 | Brewer | H10D 30/6757 |
| 2022/0199624 A1* | 6/2022 | Huang | H10B 53/30 |

* cited by examiner

*Primary Examiner* — Changhyun Yi
(74) *Attorney, Agent, or Firm* — Oblon, McClelland, Maier & Neustadt, L.L.P.

(57) ABSTRACT

A semiconductor device includes a stack of dynamic random access memory (DRAM) cell units over a substrate in a vertical direction perpendicular to a working surface of the substrate. Each DRAM cell unit includes a respective transistor, a respective capacitor and a respective bridge structure. Each bridge structure is configured to electrically couple the respective transistor to the respective capacitor. Each capacitor is elongated in a horizontal direction parallel to the working surface of the substrate.

20 Claims, 8 Drawing Sheets

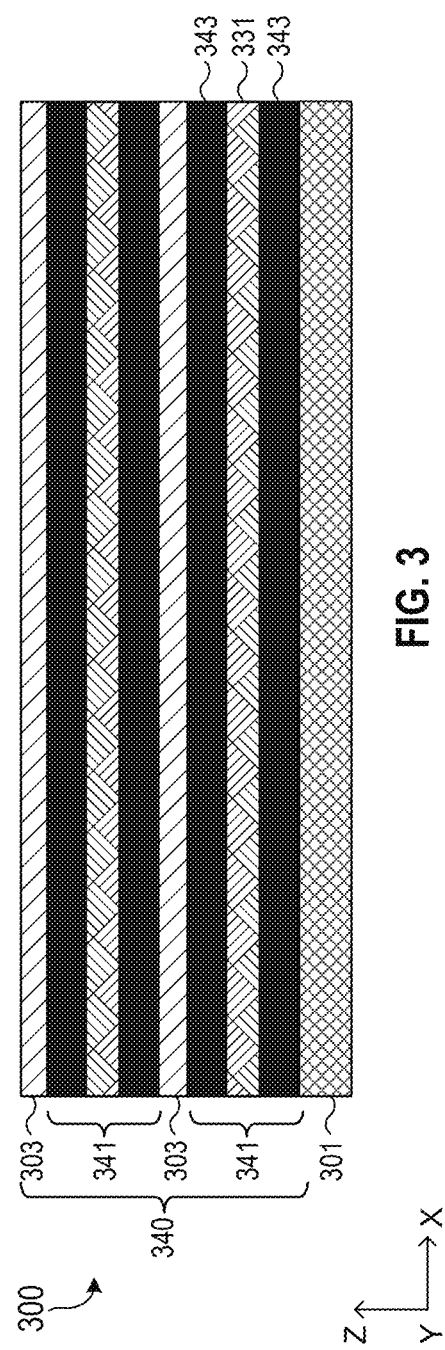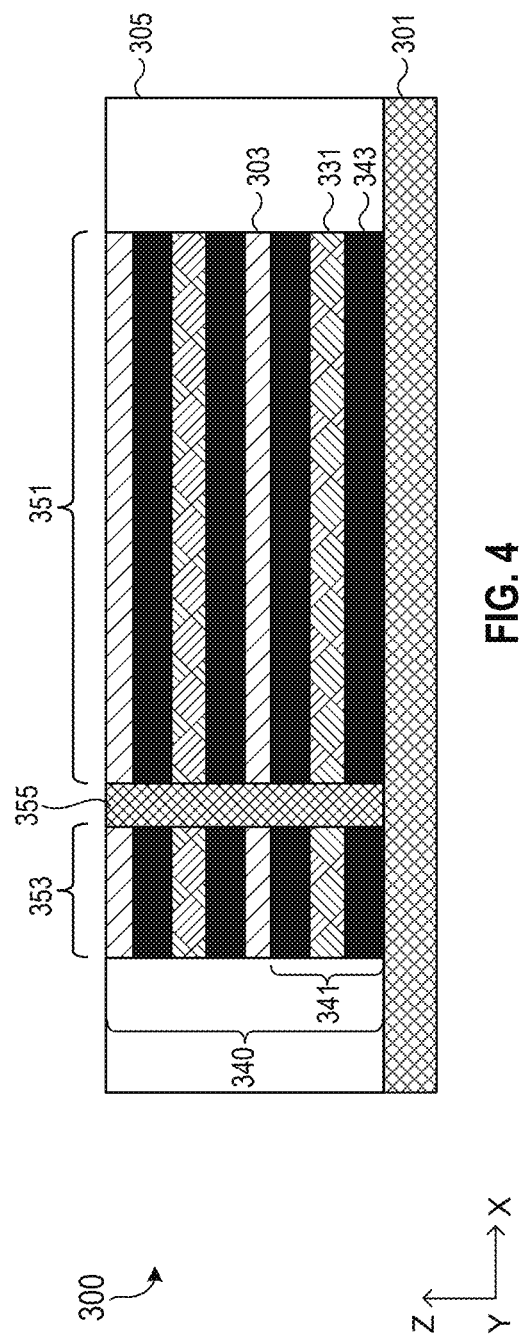
FIG. 3
FIG. 4

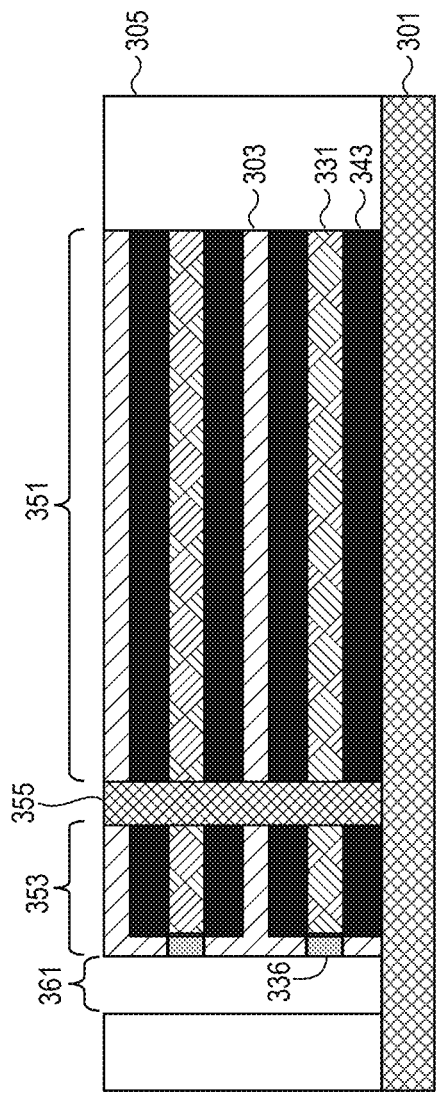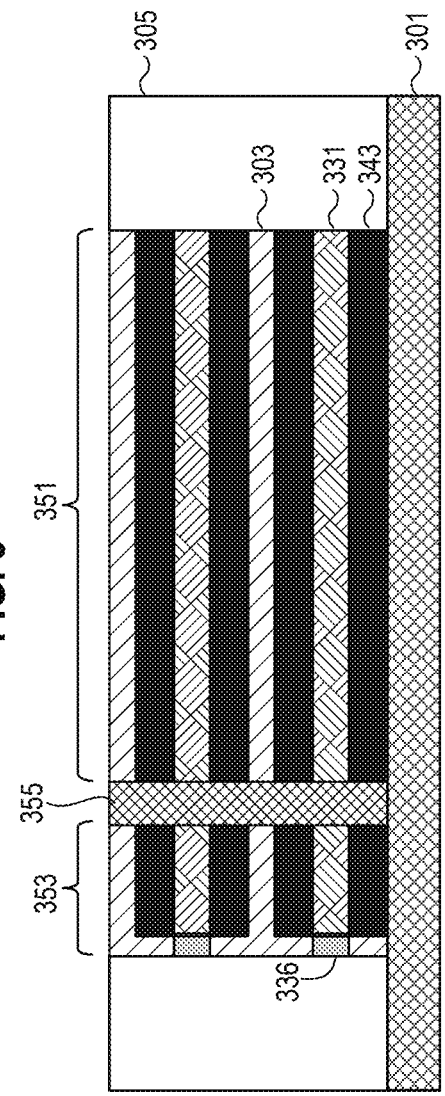

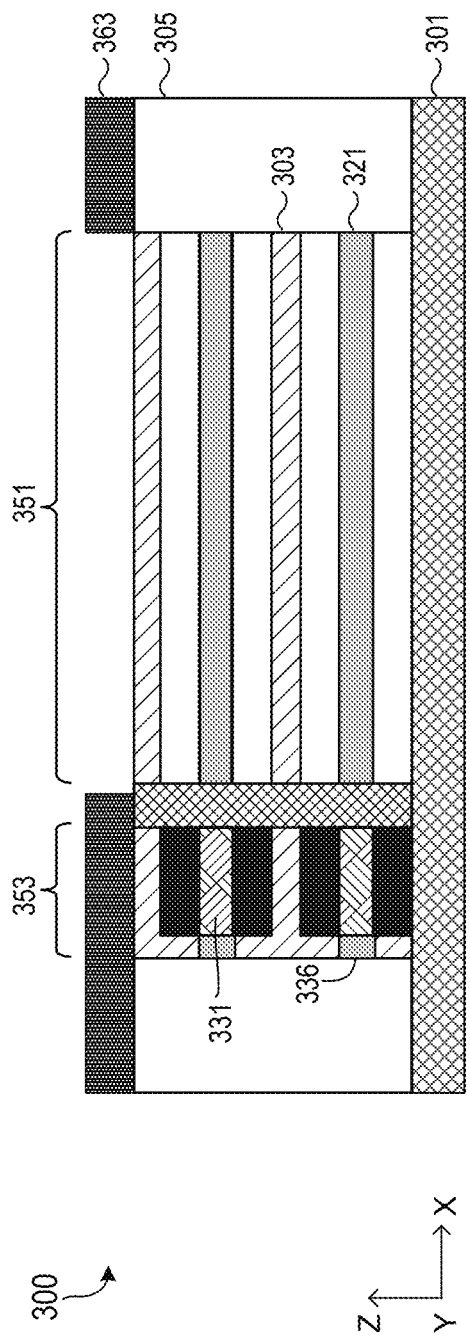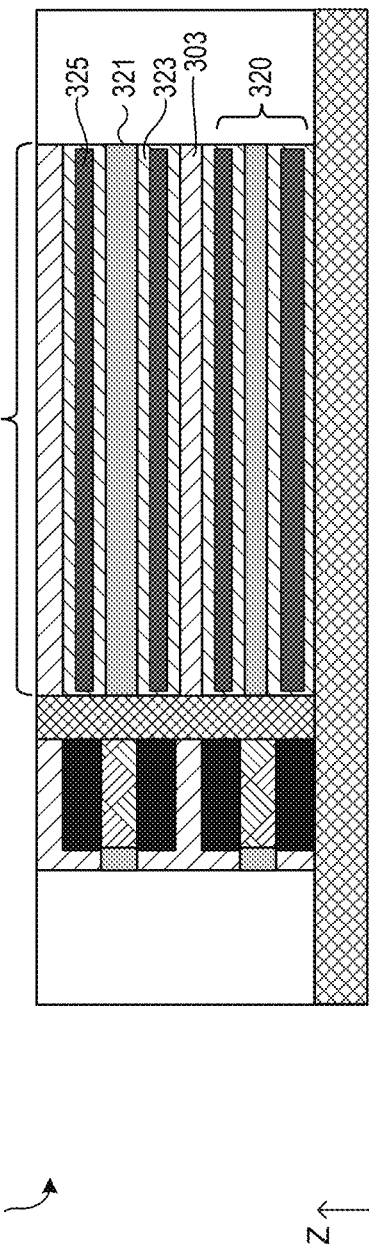
FIG. 7
FIG. 8

3D HORIZONTAL DRAM WITH IN-SITU BRIDGE

INCORPORATION BY REFERENCE

This present disclosure claims the benefit of U.S. Provisional Application No. 63/310,205, filed on Feb. 15, 2022, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of manufacturing the same.

According to a first aspect of the disclosure, a semiconductor device is provided. The semiconductor device includes a stack of dynamic random access memory (DRAM) cell units over a substrate in a vertical direction perpendicular to a working surface of the substrate. Each DRAM cell unit includes a respective transistor, a respective capacitor and a respective bridge structure. Each bridge structure is configured to electrically couple the respective transistor to the respective capacitor. Each capacitor is elongated in a horizontal direction parallel to the working surface of the substrate.

In some embodiments, each bridge structure is configured to function as a respective source/drain (S/D) region of the respective transistor.

In some embodiments, each transistor includes a respective channel structure that is configured to have a current flow path in the horizontal direction. A respective gate structure is disposed all around the respective channel structure. Another respective S/D region is positioned on an opposing end of the respective channel structure, relative to the respective bridge structure.

In some embodiments, each bridge structure is configured to be electrically coupled to a respective inner conductor of the respective capacitor.

In some embodiments, each capacitor includes a respective capacitor dielectric all around the respective inner conductor. A respective outer conductor is disposed all around the respective capacitor dielectric.

In some embodiments, each outer conductor includes metal material.

In some embodiments, each inner conductor includes doped semiconductor material.

In some embodiments, each inner conductor includes silicon. A respective channel structure of the respective transistor includes silicon. Each inner conductor and the respective channel structure include different dopants.

In some embodiments, each bridge structure includes epitaxially grown material.

In some embodiments, each bridge structure includes salicide material.

According to a second aspect of the disclosure, a method of manufacturing a semiconductor device is provided. The method includes forming a layer stack over a substrate. The layer stack includes sub-stacks separated vertically from each other. Each sub-stack includes a respective semiconductor layer positioned between respective dielectric layers. The layer stack is divided into a transistor region and a capacitor region. A respective transistor is formed in each sub-stack in the transistor region. A respective capacitor is formed in each sub-stack in the capacitor region. Each capacitor is elongated in a horizontal direction parallel to a working surface of the substrate. A respective bridge structure is formed that is configured to electrically couple each transistor to the respective capacitor.

In some embodiments, the dividing the layer stack includes directionally etching each semiconductor layer to form a respective channel structure in the transistor region. Each channel structure is configured to have a current flow path in the horizontal direction.

In some embodiments, each bridge structure is formed on one end of the respective channel structure and configured to function as a respective source/drain (S/D) region.

In some embodiments, the forming the respective transistor includes forming another respective source/drain (S/D) region on an opposing end of each channel structure, relative to the respective bridge structure. The respective dielectric layers in the transistor region are removed to uncover each channel structure. A respective gate structure is formed all around each channel structure.

In some embodiments, the forming the respective capacitor includes removing the respective dielectric layers in the capacitor region to uncover each semiconductor layer. A respective inner conductor is formed using each semiconductor layer in the capacitor region.

In some embodiments, forming the respective inner conductor includes epitaxially growing a semiconductor material on each semiconductor layer in the capacitor region or doping each semiconductor layer in the capacitor region.

In some embodiments, a respective capacitor dielectric is formed all around each inner conductor. A respective outer conductor is formed all around each capacitor dielectric.

In some embodiments, each bridge structure is formed by epitaxial growth.

In some embodiments, each bridge structure is formed by salicidation.

In some embodiments, the salicidation includes forming metal material between a respective channel structure of each transistor and a respective inner conductor of each capacitor. A respective metal silicide is formed between each channel structure and the respective inner conductor. Remaining metal material is removed.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 3, 4, 5, 6, 7, 8, 9, 10, 11, 12, 13 and 14 show cross-sectional views of a semiconductor device at various intermediate steps of manufacturing, in accordance with some embodiments of the present disclosure.

DETAILED DESCRIPTION

Figure 1:
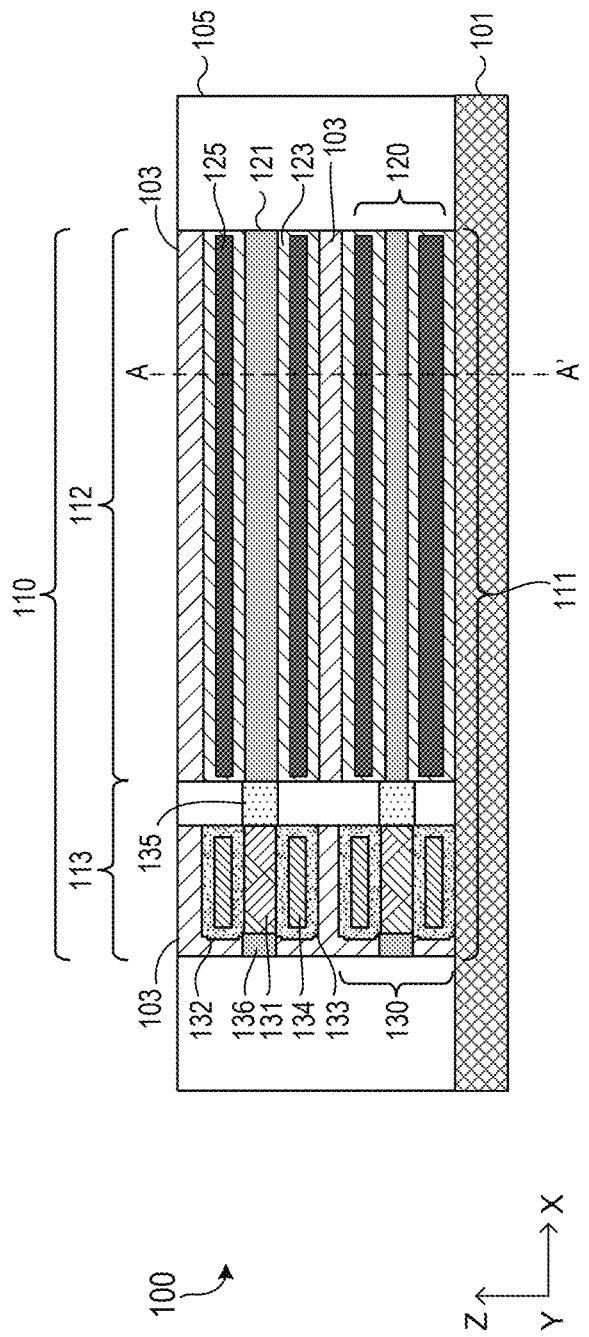
FIG. 1 shows a vertical cross-sectional view of a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on a chip)) is being pursued.

Techniques disclosed herein include designs and methods for stacked DRAM (dynamic random access memory) devices. 3D horizontal DRAM devices herein can provide a higher circuit density of DRAM memory devices. One feature herein is an in-situ channel bride, which can enable a stack of N tall DRAM devices to make a permanent 3D connect of the drain of the access transistor to the center electrode of DRAM cap cell. The in-situ bridge herein includes an epitaxially grown bridge and/or a silicide bridge. Additional new features include all source regions of 3D stack may be made with one process sequence. Because GAA (gate-all-around) access device is used, an entire stack of access transistors and capacitor cells can be integrated with one process sequence. Very high density 3D DRAM cells are thus obtained and can be N memory cells tall. 3D sequential builds are enabled memory cells herein can be integrated with 3D Logic (stacked logic) builds.

FIG. 1 shows a vertical cross-sectional view of a semiconductor device 100 in accordance with one embodiment of the present disclosure. As illustrated, the semiconductor device 100 includes a stack of dynamic random access memory (DRAM) cell units (hereinafter referred to as a memory stack 110) over a substrate 101 in the Z direction. The memory stack 110 includes a stack of capacitors (hereinafter referred to as a capacitor stack 112) and a stack of transistors (hereinafter referred to as a transistor stack 113) adjacent to each other. Consider a DRAM cell unit 111 of the memory stack 110 for example. The DRAM cell unit 111 includes a capacitor 120 that is configured to be electrically coupled to a transistor 130 by a bridge structure 135.

Specifically, the capacitor 120 includes an inner conductor 121, a capacitor dielectric 123 all around the inner conductor 121, and an outer conductor 125 all around the capacitor dielectric 123. In a non-limiting example, the inner conductor 121 includes a doped semiconductor material, such as p-type silicon, while the outer conductor 125 includes a metal material. Notably, the capacitor 120 is elongated in the X direction (relative to the Z direction). Shape of the capacitor 120 may vary, depending on specific design requirements. For example, the inner conductor 121 can be a nanosheet while the capacitor dielectric 123 and the outer conductor 125 are disposed all around the nanosheet in a YZ plane, such as in a vertical cross-sectional view taken along the line cut AA'. Accordingly, the inner conductor 121, the capacitor dielectric 123 and the outer conductor 125 can be co-axial. Additionally, the capacitor dielectric 123 may include extra portions that are disposed on and below the outer conductor 125, and such extra portions may not be configured to store charges during operation.

The transistor 130 includes a channel structure 131 and a gate structure 132 all around the channel structure 131. The gate structure 132 includes at least one gate dielectric 133 (such as a high-k dielectric) and at least one gate metal 134 (such as a work function metal (WFM)). Herein, the bridge structure 135 can be configured to function as a source/drain (S/D) region of the transistor 130. The transistor 130 also includes an S/D region 136 positioned on an opposing end of the channel structure 131, relative to the bridge structure 135. In this example, the bridge structure 135 is configured to function as a drain region while the S/D region 136 is configured to function as a source region, e.g. to receive an input signal.

Note that the channel structure 131 can be configured to have a current flow path in the X direction. Meanwhile, the bridge structure 135 (e.g. the drain region) is configured to be electrically coupled to the inner conductor 121 that is elongated in the X direction. Therefore, the DRAM cell unit 111 can be configured to function as a horizontal DRAM cell and thus can be stacked in the Z direction.

Further, the inner conductor 121 and the channel structure 131 can include a same semiconductor material, but different dopants. For instance, the inner conductor 121 and the channel structure 131 can respectively include n-type silicon and p-type silicon, or vice versa. In some embodiments, the bridge structure 135 includes epitaxially grown material, such as doped semiconductor, e.g. silicon. For instance, the bridge structure 135, the S/D region 136 and the inner conductor 121 can include a same material such as n-type silicon while the channel structure 131 can include p-type silicon. In some embodiments, the bridge structure 135 includes salicide material (self-aligned silicide material), such as a metal silicide. Particularly, the bridge structure 135 can include a metal silicide at two ends in the X direction and a corresponding metal between the two ends. The corresponding metal (e.g. a core) can be surrounded by the metal silicide (e.g. a shell). Alternatively, the bridge structure 135 includes the metal silicide without the corresponding metal.

In some embodiments, the semiconductor device 100 can include dielectric materials, e.g. as shown by 103, 105, 123 and 133. The dielectric materials may also be referred to as isolation structures, isolation layers, diffusion breaks, gate dielectrics, capping layers, etc. depending on functions thereof. For example, the dielectric material 103 can separate capacitors (e.g. 120) of the capacitor stack 112 from each other as well as separate transistors (e.g. 130) of the transistor stack 113 from each other.

In the example of FIG. 1, the memory stack 110 includes two DRAM cell units 111 stacked in the Z direction. That is, the capacitor stack 112 includes two capacitors 120 stacked in the Z direction while the transistor stack 113 includes two transistors 130 stacked in the Z direction. It should be understood that the memory stack 110 can include any number of DRAM cell units 111 stacked in the Z direction. Moreover, DRAM cell units can be similar to the DRAM cell unit 111 while having some differences. For example, channel structures of the DRAM cell units can include different chemical compositions from one another. That is, the channel structures can include different semiconductor materials, different dopants and/or different dopant concentration profiles. Similarly, inner conductors of capacitors can also include different chemical compositions from one another. Further, the semiconductor device 100 can include any number of memory stacks (e.g. 110) arranged in the XY plane (not shown).

Figure 2:
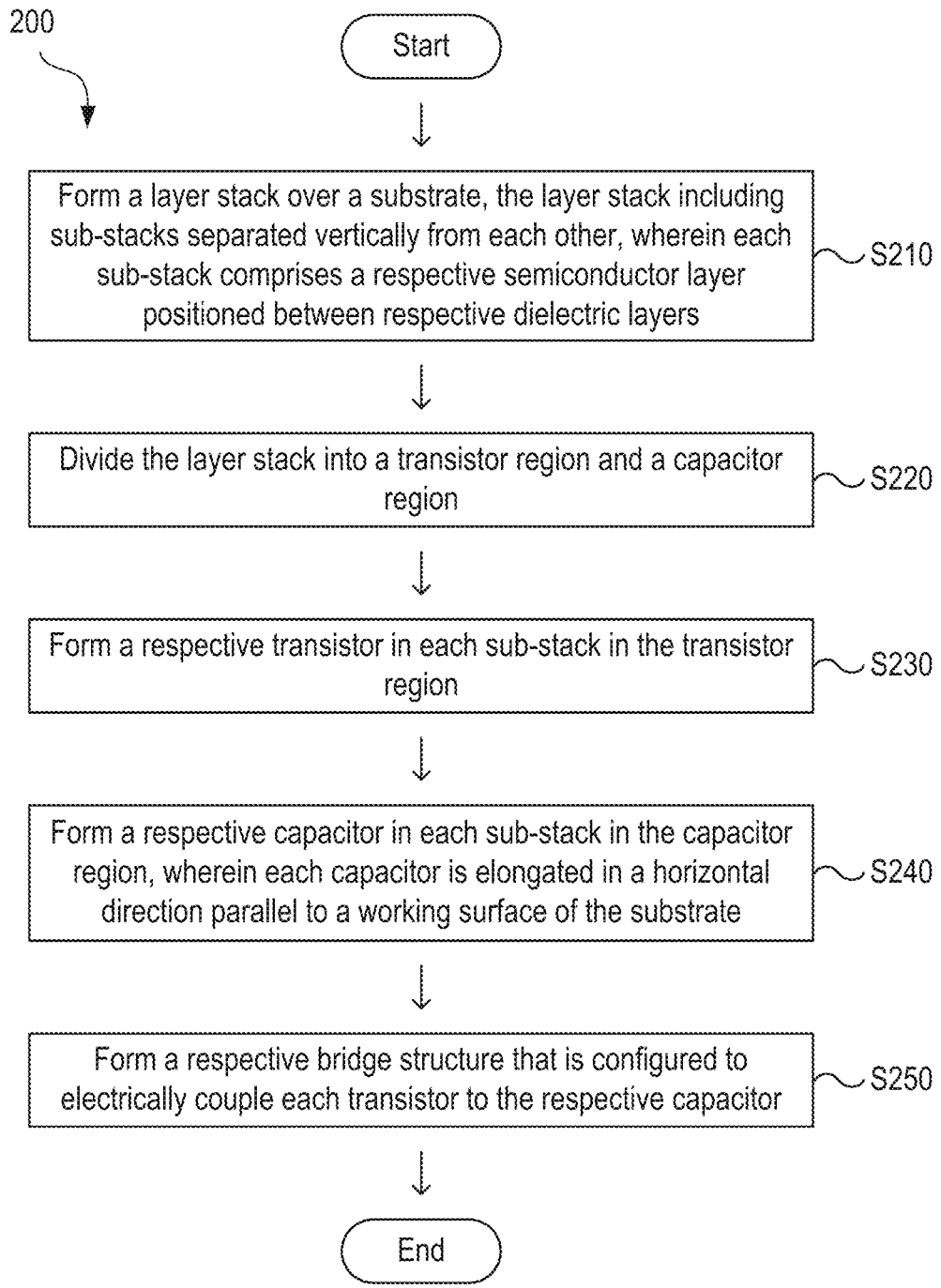
FIG. 2 shows a flow chart of a process for manufacturing a semiconductor device, in accordance with some embodiments of the present disclosure.

FIG. 2 shows a flow chart of a process 200 for manufacturing a semiconductor device, such as the semiconductor device 100, in accordance with some embodiments of the present disclosure. The process 200 starts with Step S210 by forming a layer stack over a substrate. The layer stack includes sub-stacks separated vertically from each other. Each sub-stack includes a respective semiconductor layer positioned between respective dielectric layers. At Step S220, the layer stack is divided into a transistor region and a capacitor region. At Step S230, a respective transistor is formed in each sub-stack in the transistor region. At Step S240, a respective capacitor is formed in each sub-stack in the capacitor region. Each capacitor is elongated in a horizontal direction parallel to a working surface of the substrate. At Step S250, a respective bridge structure is formed that is configured to electrically couple each transistor to the respective capacitor.

FIGS. 3, 4, 5, 6, 7, 8, 9, 10, 11, 12, 13 and 14 show cross-sectional views of a semiconductor device 300 at various intermediate steps of manufacturing, in accordance with some embodiments of the present disclosure. Devices and process flows are shown and described herein. A first flow (e.g. FIGS. 3-13) shows a 3D horizontal DRAM stack with integrated in-situ salicided channel reacted bridge structure. A second flow (e.g. FIGS. 3-11 and 14) shows a 3D horizontal DRAM stack with integrated in-situ epitaxially grown channel bridge structure. Note that the channel bridge structure can connect a horizontal DRAM drain of an access transistor to a central core electrode (e.g. an inner conductor) of a DRAM capacitor.

As illustrated in FIG. 3, the semiconductor device 300 includes a layer stack 340 formed over a substrate 301. The layer stack 340 includes sub-stacks (e.g. 341) separated vertically from each other by a dielectric material 303. Consider a sub-stack 341 for example. The sub-stack 341 includes a semiconductor layer 331 positioned between two dielectric layers 343.

In order to form the semiconductor device 300, a base layer (e.g. the substrate 301) can be any substrate such as bulk silicon. A lower sub-stack (e.g. 341) can have a p-type semiconductor layer (e.g. the semiconductor layer 331) surrounded by or disposed between the dielectric layers 343. A capping layer (e.g. the dielectric material 303) can be formed on top of the lower sub-stack. Then an upper sub-stack (e.g. 341) can be formed that repeats the lower layer stack and includes another capping layer. It should be understood that more sub-stack(s) can be formed repeatedly.

In FIG. 4, the layer stack 340 is divided into a capacitor region 351 and a transistor region 353, which are separated by a divider structure 355. This can be accomplished for example by directionally etching the layer stack 340 to form an opening (not shown) between the capacitor region 351 and the transistor region 353, before filling the opening with the divider structure 355. As a result, the semiconductor layer 331 in the transistor region 353 can be configured to function as a channel structure 331 for a future transistor. Note that the layer stack 340 can also be directionally etched into independent stacks that are arranged in the XY plane (not shown) and separated from each other by a dielectric material 305.

In a non-limiting example, W/L of future devices are formed; that is, the layer stack 340 is etched into independent stacks for future devices. Then, isolation deposition (e.g. the dielectric material 305) is executed to electrically isolate the independent stacks, followed by chemical-mechanical polishing (CMP) to planarize overburden. Note that masking to form/etch W/L of devices refers to defining a unit memory cell (one transistor plus one capacitor) or a vertical stack of unit memory cells. Also note that the dielectric material 303 can function as a capping layer, which can be a hardmask layer or another isolation layer to physically and electrically separate unit memory cells. The sub-stacks 341, apart from the capping layer, will be used for forming transistors and capacitors. The capacitors will eventually include capacitor metal and capacitor dielectric. Then, a photoresist (PR) mask can be formed and used to etch the independent stacks to separate future DRAM pass transistor from capacitor region (e.g. forming the transistor region 353 and the capacitor region 351). Subsequently, a dielectric material (e.g. the divider structure 355) can be deposited and planarized by CMP.

Note that the substrate 301 can correspond to the substrate 101. The dielectric material 303 can correspond to the dielectric material 103. The dielectric material 305 can correspond to the dielectric material 105. The sub-stacks 341 will be used to form a stack of capacitors in the capacitor region 351 and a stack of transistors in the transistor region 353.

In FIG. 5, a first opening 361 is formed to expose the transistor region 353, e.g. to open a future source side of a pass gate transistor. The dielectric layers 343 are then indent-etched to expose an end of the semiconductor layer 331, followed by epitaxial growth or plasma implantation to form a transistor source. That is, the exposed end of the semiconductor layer 331 can be doped by plasma implantation to form an S/D region 336 in the example of FIG. 5. In another example (not shown), the S/D region 336 is epitaxially grown on the exposed end of the semiconductor layer 331. Herein, the semiconductor layer 331 includes p-type silicon while the S/D region 336 includes n-type silicon.

In FIG. 6, the first opening 361 is filled, for example with the dielectric material 305, optionally followed a chemical-mechanical polishing (CMP) process. Note that S/D region 336 can correspond to the S/D region 136.

In FIG. 7, a mask 363 (e.g. a photoresist mask) is formed on the layer stack 340 to cover or protect the transistor region 353. Isolation (e.g. the dielectric material 305) on sidewalls of future capacitors (e.g. sidewalls of the layer stack 340 before and behind the cross-sectional view of FIG. 7, not shown) can be removed. Then, the dielectric layers 343 in the capacitor region 351 can be removed to expose the semiconductor layer 331 in the capacitor region 351. Subsequently, an inner conductor 321 is formed. The inner conductor 321 can correspond to the inner conductor 121.

In some embodiments, the semiconductor layer 331 can be doped to form the inner conductor 321. For instance, when the semiconductor layer 331 includes p-type silicon, an N+ plasma implantation process can be executed for the semiconductor layer 331 to become the inner conductor 321 that includes n-type silicon. In some embodiments (not shown), the inner conductor 321 can be epitaxially grown on (or all around) the semiconductor layer 331. For instance, p-type silicon can be epitaxially grown on n-type silicon.

In FIG. 8, a capacitor dielectric 323 is formed all around the inner conductor 321, and an outer conductor 325 is formed all around the capacitor dielectric 323. Consequently, a capacitor 320 is formed. The mask 363 is removed. Isolation (e.g. the dielectric material 305) can be formed on the sidewalls of the future capacitors. Note that the capacitor dielectric 323 can also include extra portions that are disposed on and below the outer conductor 325, and on ends of the outer conductor 325 in the X direction. Note that the capacitor 320 can correspond to the capacitor 120. The capacitor dielectric 323 can correspond to the capacitor dielectric 123. The outer conductor 325 can correspond to the outer conductor 125.

Figure 9:
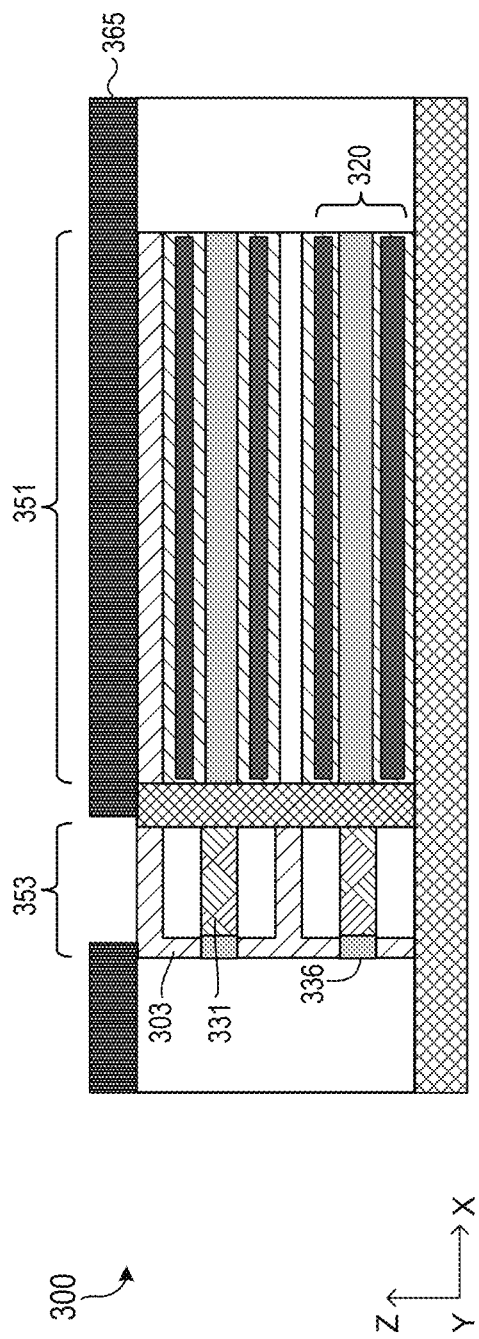

In FIG. 9, a mask 365 (e.g. another photoresist mask) is formed over the layer stack 340 to cover or protect the capacitor region 351. Isolation (e.g. the dielectric material 305) on sidewalls of future transistors (e.g. sidewalls of the layer stack 340 before and behind the cross-sectional view of FIG. 9, not shown) can be removed. Then, the dielectric layers 343 in the transistor region 353 can be removed to expose the semiconductor layer 331 in the transistor region 353. The semiconductor layer 331 herein can be configured to function as a channel structure and will thus be referred to as a channel structure 331 hereinafter. Note that the channel structure 331 can correspond to the channel structure 131.

Figure 10:
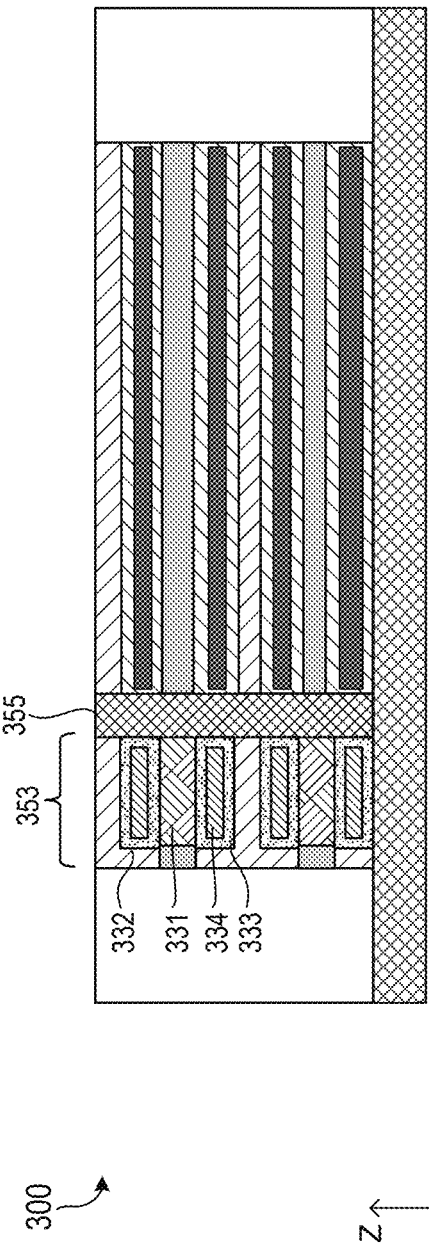

In FIG. 10, a gate structure 332 is formed all around the channel structure 331. Specifically at least one gate dielectric 333 of the gate structure 332 can be formed all around the channel structure 331 before at least one gate metal 334 of the gate structure 332 is formed all around the at least one gate dielectric 333. The mask 365 is removed. Note that the gate structure 332 can correspond to the gate structure 132. The at least one gate dielectric 333 can correspond to the at least one gate dielectric 133. The at least one gate metal 334 can correspond to the at least one gate metal 134.

Figure 11:
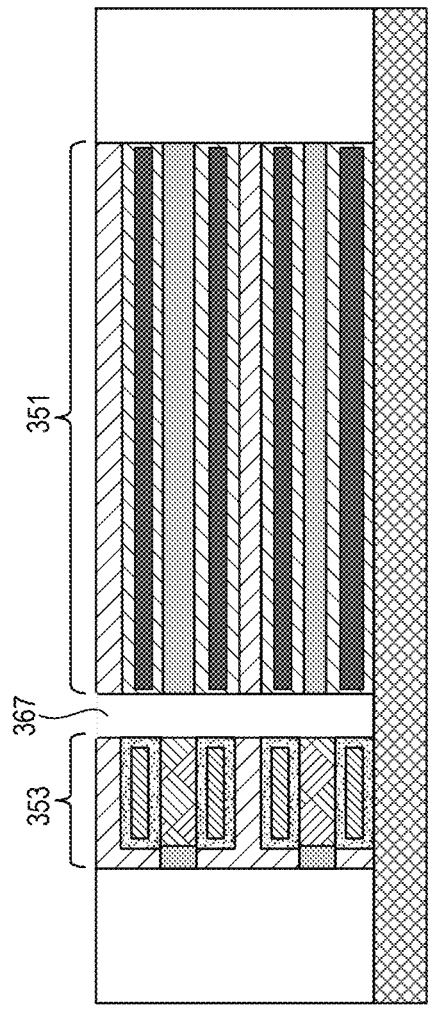

In FIG. 11, the divider structure 355 is removed to form a second opening 367.

Figure 12:
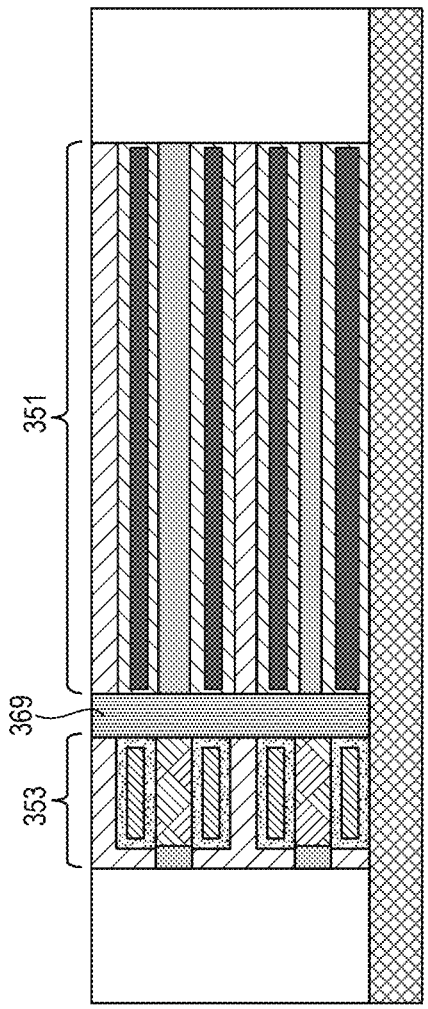

In FIG. 12, a metal material (e.g. a silicide metal) 369 is deposited in the second opening 367.

Figure 13:
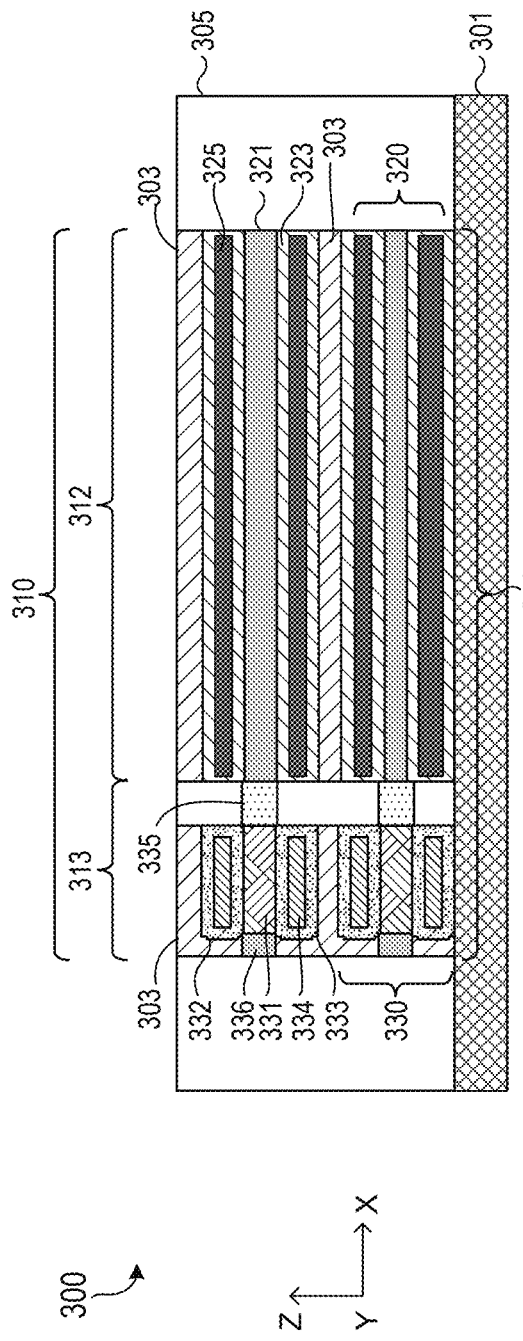

In FIG. 13, a bridge structure 335 is formed. In this example, the silicide metal is reacted to complete a silicide bridge (e.g. 335), followed by chemical rinse to remove excessive silicide metal in non-silicon regions and isolation deposition (e.g. the dielectric material 305) and CMP to finish a device stack. This completes the channel hookup between an access transistor drain side and a capacitor core electrode (e.g. 321) with the silicide bridge (e.g. 335). Thus, the bridge structure 335 can be a salicide, that is, a silicide formed by a self-aligned process. Salicidation can include depositing a silicide or transition metal on the substrate, then react the metal such as by annealing, then unreacted metal can be removed while the salicide remains. In some embodiments, the silicide metal is Ni. The bridge structure 335 can include nickel silicide. Other metals, such as Ru, Ti, Co, W, Pt, Pd, et cetera, can also be used alternatively. Further, thicknesses or penetration depth of the nickel silicide can be controlled by metal deposition and salicidation conditions.

As a result, a transistor 330 is formed in the transistor region 353, and the transistor 330 is configured to be electrically coupled to the capacitor 320 by the bridge structure 335 to form a DRAM cell unit 311. The bridge structure 335 can be configured to function as a drain region of the transistor 330 while the S/D region 336 can be configured to function as a source region of the transistor 330. Thus, a stack of DRAM cell units (also referred to as a memory stack 310) is formed which includes a stack of capacitors (also referred to as a capacitor stack 312) and a stack of transistors (also referred to as a transistor stack 313).

Note that the memory stack 310 can correspond to the memory stack 110. The capacitor stack 312 can correspond to the capacitor stack 112. The transistor stack 313 can correspond to the transistor stack 113. The DRAM cell unit 311 can correspond to the DRAM cell unit 111. The transistor 330 can correspond to the transistor 130. The bridge structure 335 can correspond to the bridge structure 135. As a result, the semiconductor device 300 can eventually become the semiconductor device 100.

Figure 14:
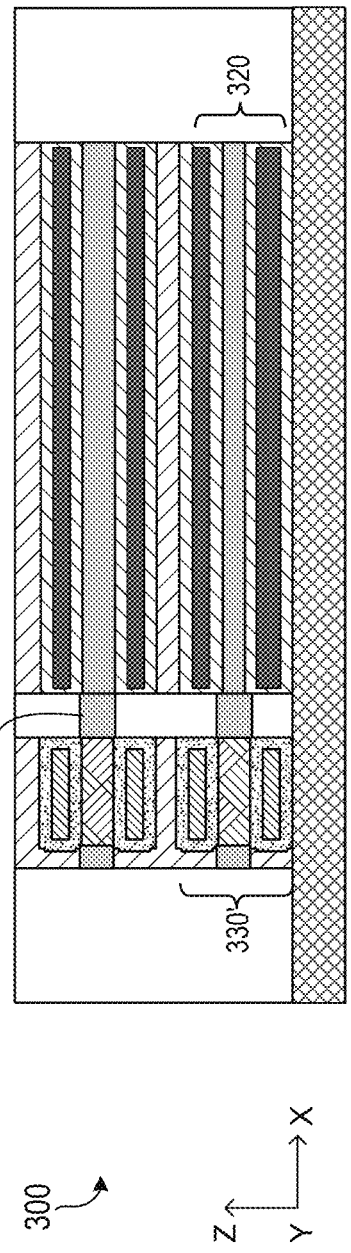

FIG. 14 shows an alternative embodiment to FIGS. 12 and 13. That is, after the second opening 367 is formed in FIG. 11, a bridge structure 335' can be epitaxially grown on (or from) the channel structure 331 and the inner conductor 321. For example, when the channel structure 331 includes p-type silicon and the inner conductor 321 includes n-type silicon, n-type silicon can be epitaxially grown on the channel structure 331 and the inner conductor 321 to form the bridge structure 335'. Similarly, the second opening 367 can then be filled with the dielectric material 305. Note that the bridge structure 335' can correspond to the bridge structure 135. As a result, the semiconductor device 300 can eventually become the semiconductor device 100.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
 a stack of dynamic random access memory (DRAM) cell units over a substrate in a vertical direction perpendicular to a working surface of the substrate,
 wherein each DRAM cell unit comprises a respective transistor, a respective capacitor and a respective bridge structure,
 each bridge structure is configured to electrically couple the respective transistor to the respective capacitor,
 each capacitor is elongated in a horizontal direction parallel to the working surface of the substrate and adjacent to and co-planar with the respective transistor in the horizontal direction, and
 each bridge structure comprises salicide material.

2. The semiconductor device of claim 1, wherein:
 each bridge structure is configured to function as a respective source/drain (S/D) region of the respective transistor.

3. The semiconductor device of claim 2, wherein each transistor comprises:
 a respective channel structure that is configured to have a current flow path in the horizontal direction,
 a respective gate structure all around the respective channel structure; and
 another respective S/D region positioned on an opposing end of the respective channel structure, relative to the respective bridge structure.

4. The semiconductor device of claim 1, wherein:
 each bridge structure is configured to be electrically coupled to a respective inner conductor of the respective capacitor.

5. The semiconductor device of claim 4, wherein each capacitor comprises:
 a respective capacitor dielectric all around the respective inner conductor; and
 a respective outer conductor all around the respective capacitor dielectric.

6. The semiconductor device of claim 5, wherein:
 each outer conductor comprises metal material.

7. The semiconductor device of claim 4, wherein:
 each inner conductor comprises doped semiconductor material.

8. The semiconductor device of claim 7, wherein:
 each inner conductor comprises silicon,
 a respective channel structure of the respective transistor comprises silicon, and
 each inner conductor and the respective channel structure comprise different dopants.

9. The semiconductor device of claim 1, wherein:
 each bridge structure comprises epitaxially grown material.

10. The semiconductor device of claim 1, wherein:
 the stack of DRAM cell units includes a stack of transistors separated in the vertical direction by dielectric material.

11. A method of manufacturing a semiconductor device, the method comprising:
 forming a layer stack over a substrate, the layer stack including sub-stacks separated vertically from each other, wherein each sub-stack comprises a respective semiconductor layer positioned between respective dielectric layers;
 dividing the layer stack into a transistor region and a capacitor region;
 forming a respective transistor in each sub-stack in the transistor region;
 forming a respective capacitor in each sub-stack in the capacitor region, wherein each capacitor is elongated in a horizontal direction parallel to a working surface of the substrate and adjacent to and co-planar with the respective transistor in the horizontal direction; and
 forming a respective bridge structure that comprises salicide material and is configured to electrically couple each transistor to the respective capacitor.

12. The method of claim 11, wherein the dividing the layer stack comprises:
directionally etching each semiconductor layer to form a respective channel structure in the transistor region, wherein each channel structure is configured to have a current flow path in the horizontal direction.

13. The method of claim 12, wherein:
each bridge structure is formed on one end of the respective channel structure and configured to function as a respective source/drain (S/D) region.

14. The method of claim 13, wherein the forming the respective transistor comprises:
forming another respective source/drain (S/D) region on an opposing end of each channel structure, relative to the respective bridge structure;
removing the respective dielectric layers in the transistor region to uncover each channel structure; and
forming a respective gate structure all around each channel structure.

15. The method of claim 11, wherein the forming the respective capacitor comprises:
removing the respective dielectric layers in the capacitor region to uncover each semiconductor layer; and
forming a respective inner conductor using each semiconductor layer in the capacitor region.

16. The method of claim 15, wherein:
forming the respective inner conductor comprises epitaxially growing a semiconductor material on each semiconductor layer in the capacitor region or doping each semiconductor layer in the capacitor region.

17. The method of claim 15, further comprising:
forming a respective capacitor dielectric all around each inner conductor; and
forming a respective outer conductor all around each capacitor dielectric.

18. The method of claim 11, wherein:
each bridge structure is formed by epitaxial growth.

19. The method of claim 11, wherein:
each bridge structure is formed by salicidation.

20. The method of claim 19, wherein the salicidation comprises:
forming metal material between a respective channel structure of each transistor and a respective inner conductor of each capacitor;
forming a respective metal silicide between each channel structure and the respective inner conductor; and
removing remaining metal material.

* * * * *